United States Patent [19]

Koyama

[11] Patent Number: 5,706,311
[45] Date of Patent: Jan. 6, 1998

[54] MODULATOR CIRCUIT

[75] Inventor: Mikio Koyama, Tokyo, Japan

[73] Assignee: Lucent Technologies Inc., Murray Hill, N.J.

[21] Appl. No.: 631,282

[22] Filed: Apr. 12, 1996

[30] Foreign Application Priority Data

Apr. 14, 1995 [JP] Japan ................................ 7-112566

[51] Int. Cl.$^6$ ............................. H04L 27/36; H04L 23/02
[52] U.S. Cl. ............................ 375/298; 375/261; 332/103
[58] Field of Search ........................... 375/298, 261, 375/308; 332/103, 100, 144; 455/102

[56] References Cited

U.S. PATENT DOCUMENTS 4,816,783  3/1989  Leitch ......................... 375/261

*Primary Examiner*—Stephen Chin
*Assistant Examiner*—Betsy Lee Deppe

[57] ABSTRACT

The goal of this invention is to offer an orthogonal modulator circuit where carrier feedthrough of the direct modulation method does not occur and there are not the two output frequencies of the indirect modulation method. A signal with the first frequency ($\omega_{c1}$) enters a first and a second modulator 30, 40 and becomes two reciprocal 90° phase shifted, four phase modulated signals $S_1$, $S_2$ that enter a first and a second mixer circuit 51, 52; a signal with the second frequency ($\omega_{c2}$) is multiplied with the two 90° phase shifted signals, and the output of the first and second mixer are added together in a SSB modulator resulting in the output of a single frequency signal.

4 Claims, 3 Drawing Sheets

MODULATOR CIRCUIT

TECHNICAL FIELD

This invention relates to orthogonal modulation circuits used in digital mobile communication.

BACKGROUND OF THE INVENTION

In recent years the popularity of portable phones has become apparent. Moreover, there is a shift from analog to the orthogonal modulated digital method. This sudden spread of portable phones is expected to continue. PDC (Personal Digital Cellular), IS54 (the North American digital cellular version "cellular system-dual mode" (portable device-base station specification adaptable)), and GSM (the Unified European Standard) have communication frequencies in the 800 MHz to 1 GHz range; PDC and PHS (Personal Handy phone System) have frequencies in the 800 MHz to 1.9 GHz range.

These four different formats used in the transmission of portable phone signals require modulation devices at those signal frequencies, for a four phased modulation of the signal, in addition to the frequency modulation of the signal. On page 28 of RCR specification standard-28 (established on Dec. 20, 1993), diagram 3.6 is of the four phase modulation procedure. Diagram 3.6 also shows the procedure for that modulation.

FIG. 6 shows the construction of an orthogonal modulator. In FIG. 6 the frequency $\omega_{c1}$ of the signal from oscillator (1) enters a 90° phase shifter (2) and the result is $\cos(\omega_{c1}t)$ and $-\sin(\omega_{c1}t)$. The output from 90° phase shifter (2) enters mixers 3 and 4 respectively, where it is multiplied with baseband signals I(t) and Q(t). The output from mixers 3 and 4 enter adder (5) resulting in output S(t) shown in the formula below:

$$S(t)=I(t)*\cos(\omega_{c1}t)-Q(t)*\sin(\omega_{c1}t)$$

As shown in FIG. 7, for example, for the wave S(t) to be radiated, two mixers 3, 4 must operate at a high frequency of either 900 MHz or 1.9 GHz. These frequencies are $(\omega_{c1}+\omega_{c2})$ or $(\omega_{c2}-\omega_{c1})$, so if it is not 900 MHz then it is 1.9 GHz; FIG. 6 has the same output signal. For example, if $\omega_{c1}+\omega_{c2}=1.9$ GHz, then the frequency of oscillator 1 can be set at $\omega_{c1}=200$ MHz and the frequency of oscillator 6 can be set of $\omega_{c2}=1700$ MHz. This way it is necessary for only one mixer to operate at a high frequency, making it possible to reduce electrical consumption.

However, since the output contains both frequency converted signals of frequencies $(\omega_{c1}+\omega_{c2})$ and $(\omega_{c2}-\omega_{c1})$, a filter is necessary to make the selection resulting in an increase in the cost, and preventing miniaturization of mixer 7. The two methods shown in FIGS. 6 and 7 are well used in the integration of the transmitting section; the circuit in FIG. 6 is the direct modulation method and the circuit in FIG. 7 is the indirect modulating method.

In the modulator circuit of FIG. 6, the signal with the frequency $\omega_{c1}$ from oscillator 1 becomes a wave which interferes with the circuit causing parasitic capacitance, especially in the mixer responsible for the output signal. This is called carrier feedthrough. In a direct modulator, since the frequency of oscillator 1 is the same frequency as the output signal, a filter cannot be used to remove the interference. Because signal quality is greatly degraded when carrier feedthrough occurs, extremely careful planning of the mixer is necessary to prevent signal interference, specifically, these measures are necessary for the circuits around the integrated circuit, especially the oscillator circuit; therefore, there are great limitations in the execution of an orthogonal phase modulator relying on the direct modulation method.

SUMMARY OF THE INVENTION

The goal of this invention is to offer an orthogonal modulator circuit, where carrier feedthrough of the direct modulation method does not occur and there are not the two output frequencies of the indirect modulation method.

A signal with the first frequency $(\omega_{c1})$ enters a first and a second modulator, and becomes two reciprocal 90° phase shifted four phase modulated signals that enter a first and a second mixer circuit; a signal with the second frequency $(\omega_{c2})$ is multiplied with the two 90° phase shifted signals, and the output of the first and second mixer are added together in a single side band (SSB) modulator resulting in the output of a single frequency signal.

Since the output frequency is different due to modulation, the carrier feed through produced in a direct modulation method does not occur. In addition, although there are the two converted frequencies, as in the indirect modulation method, due to an SSB modulator an output of only a single frequency is achieved, making it unnecessary for a filter on the output side.

Figure 1:
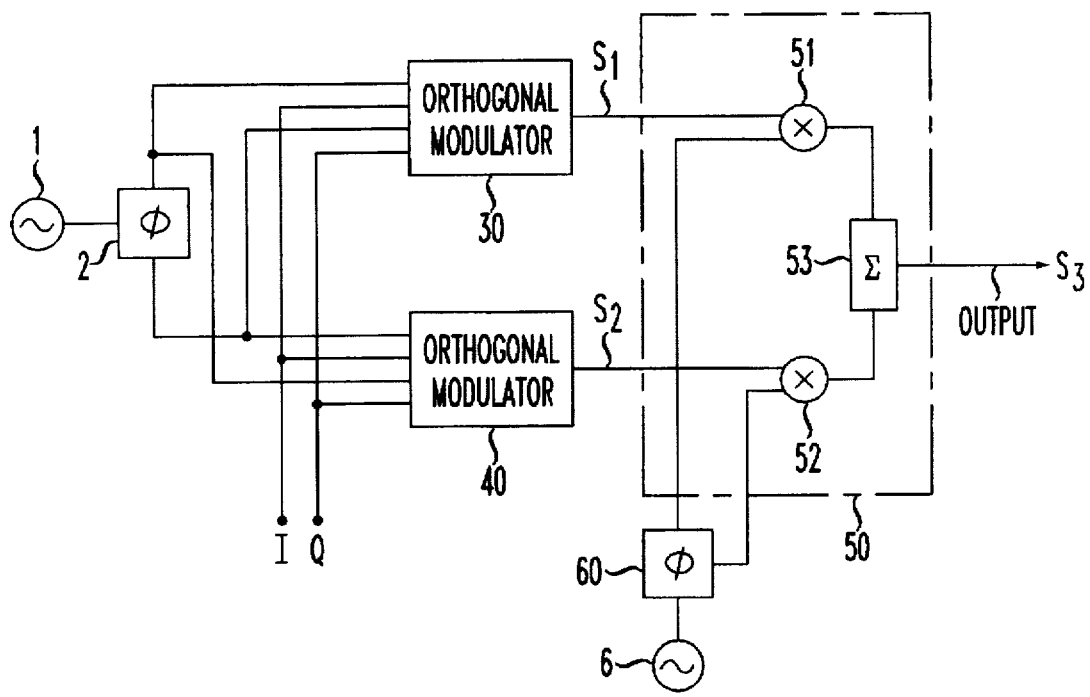
FIG. 1 is a block diagram showing the construction of this invention, an orthogonal modulation circuit.

[Explanation of the Numbers Used in the Figures]

1, 6 oscillators
2, 60 90° phase shifters
30, 40 orthogonal modulators
31 32, 41, 42 mixers
33, 43 adders
44, 45 180 degree phase shifters
50 mixer circuit
51, 52 mixers
53 adder

DETAILED DESCRIPTION

Below is an explanation of an application of this invention based on the schematic of the orthogonal modulator circuit in FIG. 1. In FIG. 1 there are two orthogonal modulators 30, 40 which have output signals with reciprocal 90° phase shifts. These two 90° shifted signals enter the SSB (single sideband) modulator's mixing circuit 50. The signal from oscillator 6 passes through a 90° phase shifter 60 which changes it to a reciprocal 90° phase shifted signal, resulting in two signals that enter mixer circuit 50.

The two reciprocal 90° phase shifted signals enter mixer circuit 50 and are SSB modulated, but the two frequencies are not present at the output terminal, rather the result is a single frequency output. Therefore, it is not necessary to use a filter to choose among the two output frequencies of an output signal.

Figure 2:
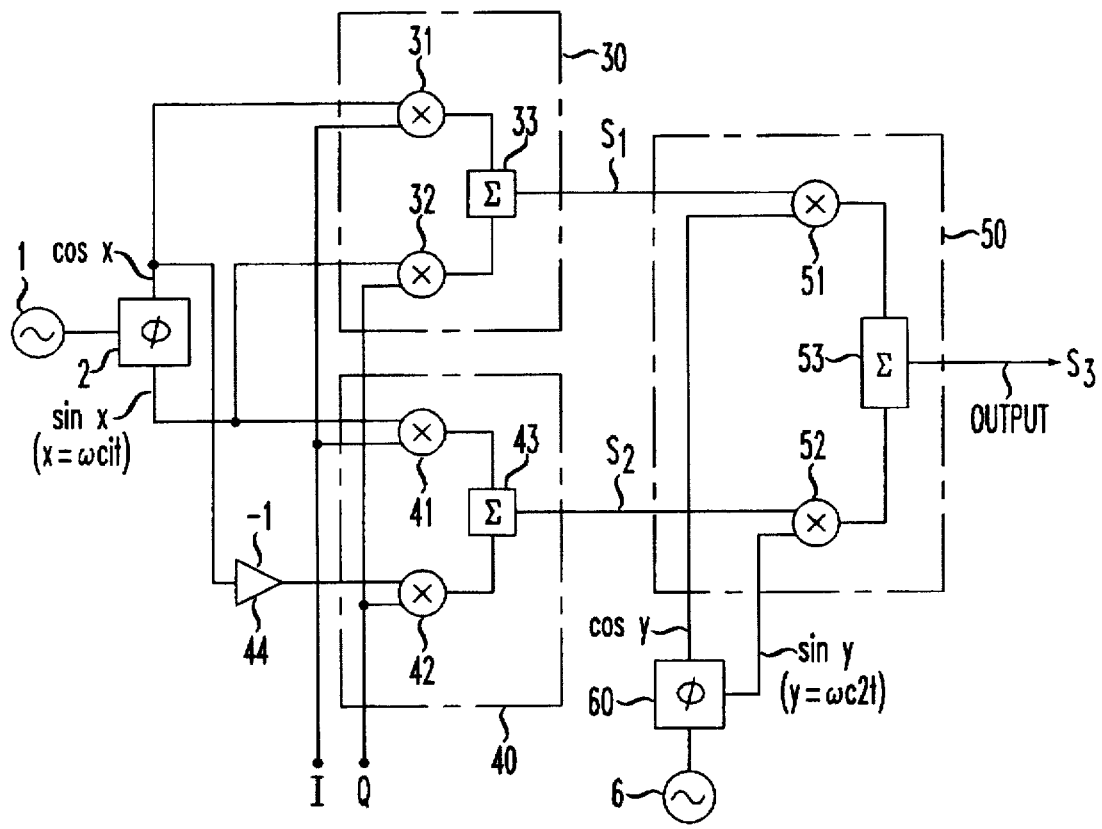
FIG. 2 is a block showing the first concrete application of the circuit in FIG. 1.

In FIG. 2 the application of the orthogonal modulators 30, 40 in FIG. 1 are concurrently shown. In FIG. 2, orthogonal modulators 30 and 40 are the same type of orthogonal modulators and use the direct modulation method. Orthogonal modulator 30 contains mixers 31, 32 and adder 33. Both baseband signals enter orthogonal modulators 30, 40 and produce two 90° phase shifted signals.

Figure 6:
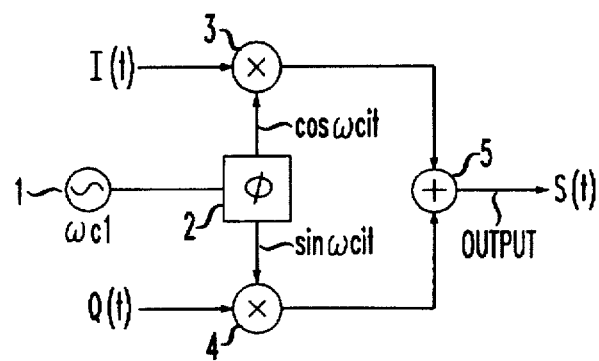
FIG. 6 is a block diagram showing the construction of an orthogonal modulator, based on the current technology, using the direct modulation method.
Figure 7:
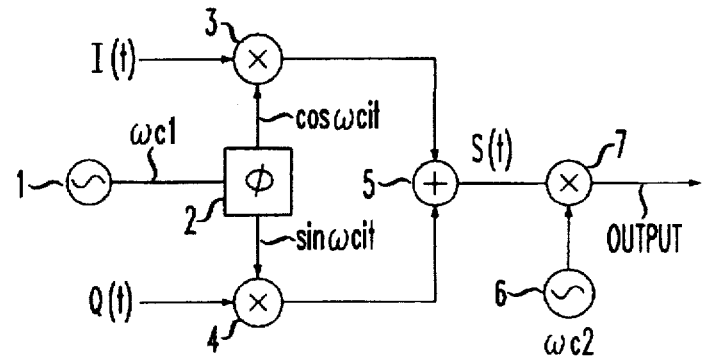
FIG. 7 is a block diagram showing the construction of an orthogonal modulator, based on the current technology, using the indirect modulation method.

One of the input terminals of orthogonal modulator 40 receives the carrier frequency after it has passed through a 180° phase shifter 44. Because of this, the phase of the output signal $S_2(t)$ from orthogonal modulator 40 is shifted 90° from the phase of output signal $S_1(t)$ from orthogonal modulator 30. Inside of the mixer circuit 50 are mixers 51, 52 which receive as input the output signals $S_1(t)$, $S_2(t)$ from orthogonal modulators 30, 40 respectively; then the output signal with frequency $\omega_{c2}$ from oscillator 6 passes through a 90° phase shifter 60 before entering mixer circuit 50. The output signals of mixers 51, 52 enter adder 53. Constructed this way, if a low frequency of, for example, 200 MHz is used for the frequency of oscillator 1, it is easier to reduce interference with a carrier of an output frequency $\omega_{c1}$, than a modulator running at 900 MHz (FIG. 6).

Here $x=\omega_{c1}t$, $y=\omega_{c2}t$ and I(t), Q(t) are I, Q respectively. The output from adders 33, 43 is $S_1(t)=I*\cos(x)+Q*\sin(x)$ and $S_2(t)=I*\sin(x)-Q*\cos(x)$, respectively. The phases are reciprocally shifted 90°. The phases of the input signals of the orthogonal modulators are not limited to those shown in FIG. 2. It is possible to think of numerous other examples that will result in an output signal reciprocally shifted 90°.

As for the output signal $S_3$, using the case of frequency $\omega_{c1}+\omega_{c2}$ and the case of frequency $\omega_{c2}-\omega_{c1}$, results in the four possibilities shown below:

In the case of frequency $\omega_{c2}-\omega_{c1}$, $$S_3=I*\cos(y-x)-Q*\sin(y-x) \quad (1)$$

$$S_3=I*\cos(y-x)+Q*\sin(y-x) \quad (2)$$

In the case of frequency $\omega_{c1}+\omega_{c2}$, $$S_3=I*\cos(x+y)-Q*\sin(x+y) \quad (3)$$

$$S_3=I*\cos(x+y)+Q*\sin(x+y) \quad (4)$$

If an alternative form of formula 1 is used the function for the circuit in FIG. 2 is derived as follows:

$$S_3=\cos(y)*[I*\cos(x+Q)*\sin(x)]+\sin(y)*[I*\sin(x-Q)*\cos(x)] \quad (5)$$

Figure 3:
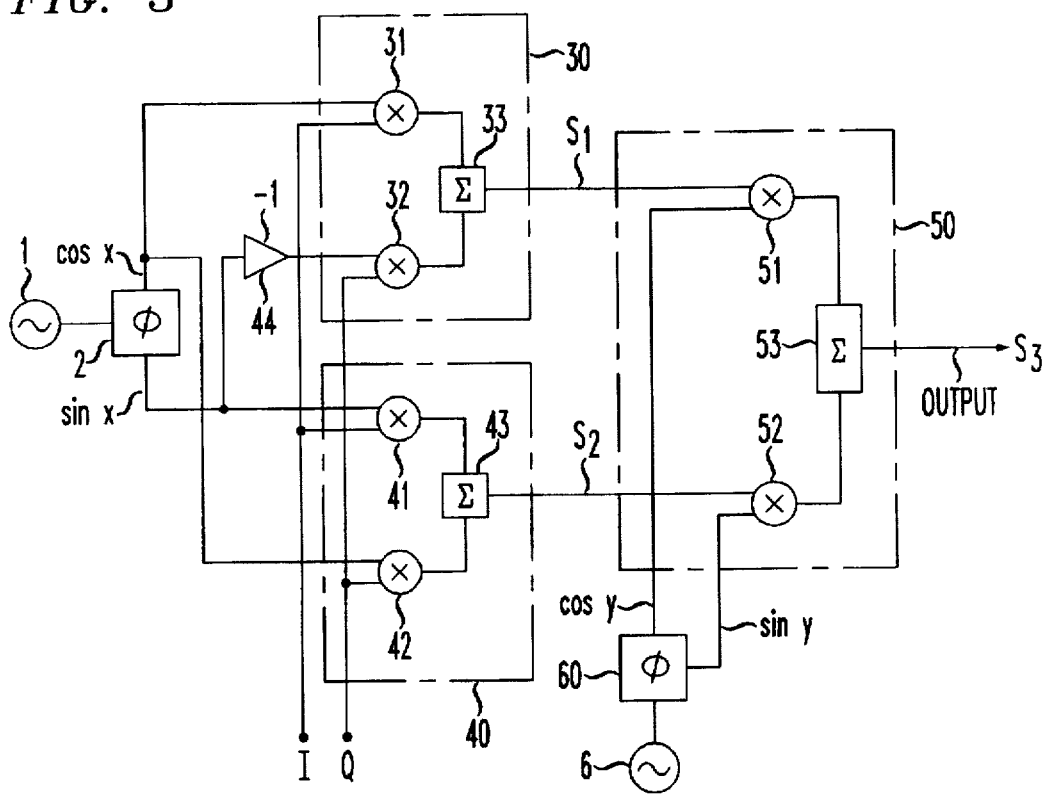
FIG. 3 is a block diagram showing the second concrete application of the circuit in FIG. 1.

FIG. 3 is the circuit of the second application. It differs from FIG. 2 in that 180° phase shifter circuit 44 is connected to the input terminal of mixer 32. $S_1(t)=I*\cos(x)-Q*\sin(x)$ and $S_2(t)=I*\sin(x)+Q*\cos(x)$, pertains to FIG. 3. If an alternative form of formula 2 is used, the function for the circuit in FIG. 3 is derived as follows:

$$S_3=\cos(y)*[I*\cos(x-Q)*\sin(x)]+\sin(y)*[I*\sin(x-Q)*\cos(x)] \quad (6)$$

Figure 4:
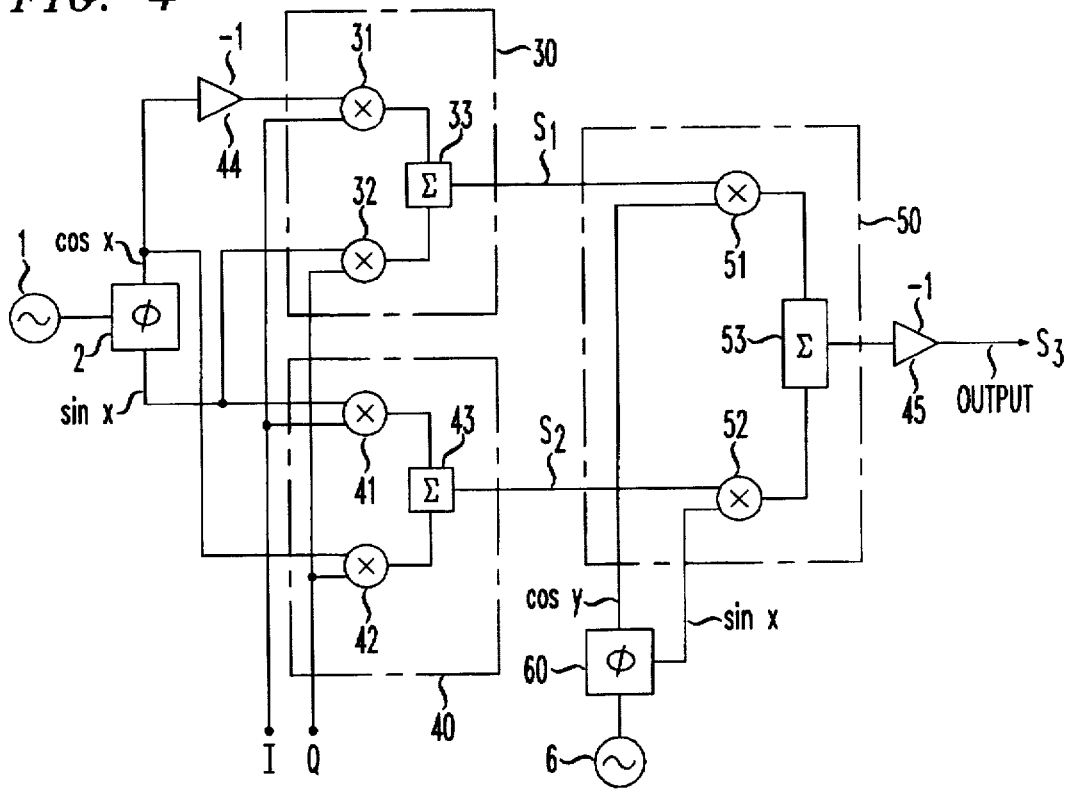
FIG. 4 is a block diagram showing the third concrete application of the circuit in FIG. 1.

FIG. 4 is the circuit of the third application. It differs from FIG. 2 in that 180° phase shifter circuit 44 is connected to the input terminal of mixer 31, and 180° phase shifter 45 is connected to the output terminal of adder 53. $S_1(t)=-I*\cos(x)+Q*\sin(x)$ and $S_2(t)=I*\sin(x)+Q*\cos(x)$, pertains to FIG. 4. If an alternative form of formula 3 is used the function for the circuit in FIG. 4 is derived as follows:

$$S_3=\cos(y)*[I*\cos(x-Q)*\sin(x)]-\sin(y)*[I*\sin(x+Q)*\cos(x)] \quad (7)$$

Figure 5:
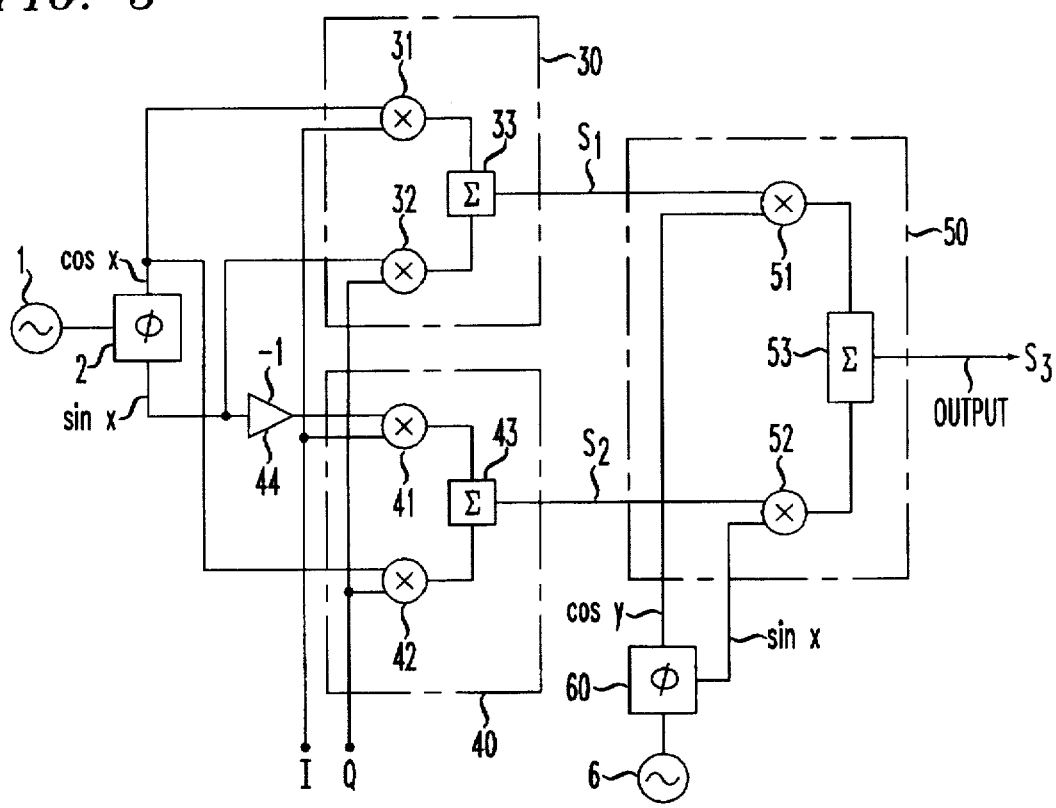
FIG. 5 is a block diagram showing the fourth concrete application of the circuit in FIG. 1.

FIG. 5 is the circuit of the fourth application. It differs from FIG. 2 in that the 180° phase shifter circuit 44 is connected to the input terminal of mixer 41. $S_1(t)=I*\cos(x)+Q*\sin(x)$ and $S_2(t)=-I*\sin(x)+Q*\cos(x)$ pertains to FIG. 5. If an alternative form of formula 4 is used the function for the circuit in FIG. 5 is derived as follows:

$$S_3=\cos(y)*[I*\cos(x+Q)*\sin(x)]+\sin(y)*[-I*\sin(x-Q)*\cos(x)] \quad (8)$$

The variations possible from using these functions are not listed to the circuits 2 to 5. It is possible to construct variations with the same formulas 5 through 8 by placing the 180° phase shifters at the I signal or Q signal, input terminals of mixers 31, 32, 41, 42 or by inverting the output signal of oscillator 6. In addition, this invention is not limited to π/4 shifted QPSK phase modulation. It is also possible to use GMSK frequency modulation.

As stated above, this invention offers a modulation circuit where carrier feedthrough does not occur in the region of the output signal, and since the output signal is a single frequency, a filter at the output side is unnecessary.

The invention claimed is:

1. A modulation circuit comprising:

first and second modulators (30, 40) adapted to receive a signal having a first frequency ($\omega_{c1}$) and to produce outputs that are reciprocal 90° phase shifted, phase modulated or frequency modulated first signal ($S_1$) and second signal ($S_2$) outputs respectively;

first and second mixer circuits (51 and 52), each of the first and second mixer circuits having a respective pair of first and second input terminals, the first input terminals of the first and second mixer circuits (51 and 52) adapted to receive the first signal ($S_1$) and the second signal ($S_2$), respectively;

a phase shifter adapted to reciprocally phase shift 90° a second signal having a second frequency ($w_{c2}$) to supply a third signal and a fourth signal for the second input terminals of the first mixer (51) and the second mixer (52); and a first adder (53) adapted to add the output signals of the first mixer (51) and the second mixer (52) to provide a single frequency output signal; wherein the first modulator comprises third and fourth mixers (31, 32), the output of the third and fourth mixers being added by a second adder (33);

the second modulator comprises fifth and sixth mixers (41, 42), the output of fifth and sixth mixers being added by a third adder (43); and further comprising a circuit adapted to produce a fifth signal from the signal having the first frequency ($\omega_{c1}$), the fifth signal being provided to first input terminals of the third and sixth mixers (31, 42), the circuit including a 90° phase shifter to produce a 90° phase shifted sixth signal from the fifth signal, the circuit supplying the sixth signal to the first input terminals of the fourth and fifth mixers (32, 41); and, a 180° phase shifter circuit before any one of the first or second input terminals of the third, fourth, fifth and sixth mixers (31, 32, 41, 42).

2. A method of modulating, comprising the steps of:

receiving a first signal having a first frequency;

producing a second signal having the first frequency from the first signal and providing the second signal to first and second modulators;

producing a third signal, orthogonal to the second signal, and supplying the third signal to the first and second modulators;

180° phase shifting one of the second and third signals prior to supplying the one of the second and third signals to one of the first and second modulators;

producing in the first and second modulators first and second output signals having an orthogonal relationship;

introducing the first and second output signals respectively to a first input terminal of first and second mixers;

phase shifting a fourth signal having a second frequency to produce third and fourth output signals;

introducing the third and fourth output signals respectively to a second input terminal of the first and second mixers; and adding output signals of the first and second mixers to provide a single frequency output signal.

3. A method of modulating a signal having a first frequency, comprising the steps of:

producing an orthogonal signal from the signal;

180° phase shifting one of the signal and the orthogonal signal to produce a phase-shifted signal and a non-phase-shifted signal;

producing a first modulated signal based on the signal and the orthogonal signal;

producing a second modulated signal based on the phase-shifted signal and the non-phase-shifted signal;

mixing the first modulated signal with another signal having a second frequency to produce a first mixed signal;

mixing the second modulated signal with a second orthogonal signal having the second frequency to produce a second mixed signal; and adding the first and second mixed signals to produce a single frequency output signal.

4. A modulation circuit comprising:

first and second modulators each adapted to receive two baseband signals having a first frequency and to produce output signals that are respectively reciprocal 90° phase shifted, phase modulated or frequency modulated first and second output signals;

first and second mixer circuits, each having first and second input terminals, the first input terminal of the first mixer circuit adapted to receive the first output signal and the first input terminal of the second mixer circuit adapted to receive the second output signal;

a source of third and fourth output signals, the third output signal being orthogonal to the fourth output signal and being provided to the second input terminal of the first mixer circuit, the fourth output signal being provided to the second input terminal of the second mixer circuit;

an adder adapted to receive output signals of the first and second mixer circuits and to produce a single frequency output signal; and a 180° phase shifter circuit adapted to phase shift one of the two baseband signals prior to its receipt by one of the first and second modulators.

* * * * *